United States Patent [19]

Nogami et al.

[11] Patent Number: 5,003,183
[45] Date of Patent: Mar. 26, 1991

[54] ION IMPLANTATION APPARATUS AND METHOD OF CONTROLLING THE SAME

[75] Inventors: Mamoru Nogami; Nobuo Nagai, both of Kyoto, Japan

[73] Assignee: Nissin Electric Company, Limited, Kyoto, Japan

[21] Appl. No.: 520,728

[22] Filed: May 9, 1990

[30] Foreign Application Priority Data

May 15, 1989 [JP] Japan .................................. 1-122450
Jul. 13, 1989 [JP] Japan .................................. 1-181273

[51] Int. Cl.⁵ .......................................... H01J 37/317
[52] U.S. Cl. .................................. 250/492.2; 250/398
[58] Field of Search ............... 250/492.21, 492.2, 398, 250/492.3

[56] References Cited

U.S. PATENT DOCUMENTS 4,733,091  3/1988  Robinson et al. ................. 250/492.2
4,899,059  2/1990  Freytsis ............................ 250/492.2

Primary Examiner—Jack I. Berman
Attorney, Agent, or Firm—Finnegan, Henderson, Farabow, Garrett, and Dunner

[57] ABSTRACT

An ion implantation apparatus comprises: an implantation chamber into which an ion beam is entered, the ion beam being scanned in an X direction; a holder for holding a wafer in the implantation chamber; and a holder drive unit for mechanically scanning the holder in a Y direction substantially perpendicular to the X direction in the implantation chamber. The holder drive unit swingingly rotates the holder so that the wafer is mechanically scanned in the Y direction.

11 Claims, 8 Drawing Sheets

ION IMPLANTATION APPARATUS AND METHOD OF CONTROLLING THE SAME

BACKGROUND OF THE INVENTION

The present invention relates to a hybrid scanning type ion implantation apparatus in which an ion beam is electrically scanned and a wafer is mechanically scanned in the direction substantially perpendicular to the scanning direction of ion beam, and method of controlling the same.

FIG. 1 shows a prior art of such a type of ion implantation apparatus.

With scanning means (not shown), an ion beam 2 is electrically scanned in the X direction (for example, in the horizontal direction). The ion beam may be arranged into a parallel beam by using an electric field or a magnetic field as shown in the drawing. The parallely arranged ion beam 2 is guided to an implantation chamber (not shown). A holder 1300 for holding a wafer 4 is disposed in the implantation chamber. The holder 1300 is mechanically scanned by a holder drive unit 1360 in the Y direction perpendicular to the X direction (for example, in the vertical direction).

The holder drive unit 1360 mainly comprises a holder raising unit 1320 for rotating the holder 1300 between a vertical position in which ions are implanted to the wafer 4 and a horizontal position in which the wafer 4 is handled and a holder lifting unit 1340 for lifting and lowering the holder 1300 along with the holder raising unit 1320 in the Y direction so as to mechanically scan the wafer 4.

However, according to the above described structure, the holder lifting unit 1340 is such that a rotation movement by a motor is converted into a linear movement by using, for example, worm gears, so that its stroke is long. Thus, if the entirety of these mechanisms is contained in the implantation chamber, a vacuum container becomes large and this type of apparatus becomes large.

On the other hand, if the motor is positioned in the atmosphere, a slide shaft moving linearly to lift and lower the holder 1300 goes in and out the implantation chamber of vacuum state and the atmosphere. Thus, it is necessary to design not to bring the air and the like into the implantation chamber through the linear movement of the slide shaft. For example, a dynamic vacuum seal system has been considered in which the slide shaft passing through the vacuum container is constructed to slide through a plurality of divided chambers at non-contact state and the respective chambers are differentially exhausted by respective vacuum pumps. However, the system is disadvantageous in that it is very complicated and exhausting the implantation chamber into high vacuum is difficult so that a high power vacuum pump must be used for the implantation chamber.

SUMMARY OF THE INVENTION

The present invention has been made to overcome the above described disadvantages. An object of the present invention is therefore to provide an ion implantation apparatus in which an arm with a holder for holding a wafer is swingingly rotated by a rotation movement of a motor so that the wafer is mechanically scanned in the Y direction substantially perpendicular to the X direction in which an ion beam is scanned, without using the above dynamic vacuum seal system and the like.

Another object of the present invention is to provide a method of controlling the ion implantation apparatus so that the wafer is uniformly ion implantated.

To accomplish the above object, a holder drive unit of the ion implantation apparatus according to the first embodiment of the present invention comprises a bearing having a vacuum seal function disposed on the side wall section of the implantation chamber, a spindle passed through the bearing in the X direction, a first reversely rotatable direct drive motor, whose output shaft is connected to the end section of the spindle outside the implantation chamber, a second reversely rotatable direct drive motor, whose output shaft is connected to the end section of the spindle inside the implantation chamber, and is nearly perpendicular to the spindle, an arm connected nearly perpendicularly to the output shaft of the second direct drive motor, and a third reversely rotatable direct drive motor, whose output shaft is connected nearly perpendicularly to the arm, the holder being connected nearly perpendicularly to the output shaft of the third direct drive motor.

The spindle is rotated by the first direct drive motor. The holder disposed at the end of the spindle through the arm and the like can be driven between a predetermined implantation angle position and a horizontal position for handling the wafer.

In the implantation angle position, when the second direct drive motor is rotated in the forward direction and the backward direction, the holder connected to the end of the arm is mechanically scanned in the Y direction so as to draw an arc locus while the wafer is faced to the ion beam.

At that time, when the third direct driver motor is rotated in the same direction as the second direct drive motor (viewed from the output shaft of each motor) by the same angle, even if the holder is scanned in the arc shape, the absolute rotation angle of the holder is 0° and its posture is not changed Thus, also the posture of the wafer mounted on the holder is not changed In addition, when the ion beam is parallely arranged in the X direction, ions can be equally implanted in the wafer.

In an ion implantation apparatus according to the second embodiment of the present invention, a holder drive unit comprises a hollow arm shaft pivotally supported in the implantation chamber so that it is placed nearly in parallel with the moving direction of an ion beam, a drive means for rotatably driving the arm shaft both in the forward and backward directions, an intermediate shaft rotatably passed through the arm shaft, the intermediate shaft not following the rotation of the arm shaft, an arm attached nearly perpendicularly to the arm shaft, a holder shaft pivotally connected to the end section of the arm so that the holder shaft is placed nearly in parallel with the moving direction of the ion beam, a holder being connected nearly perpendicularly to the end section of the holder shaft, and connection means for connecting the holder shaft and the intermediate shaft at a given rotation ratio.

When the arm shaft is rotated by the drive means of the holder drive unit, the holder connected to the end section of the arm is mechanically scanned in an arc shape in the Y direction while the wafer faces an ion beam.

In this case, since the intermediate shaft does not follow the rotation of the arm shaft and the intermediate shaft is connected to the holder shaft by the connection means at the same rotation ratio, even if the holder is scanned in the arc shape, the posture of the holder does not change.

Further, in the method of controlling the ion implantation apparatus according to the third embodiment of the present invention, angular speed ω of the arm at the swing rotation is controlled so that the following equation or the relationship substantially equivalent thereto is satisfied:

$$\omega = \{\alpha/(L_{arm} \cdot \cos \theta)\} I \quad (a)$$

wherein
I: beam current of the ion beam 2,
$L_{arm}$: length between the center of the swing rotation of the arm and the center point of the wafer,
θ: angle of the arm from the X direction at the swing rotation,
ω: angular speed of the arm at the swing rotation, and
α: proportional constant When the angular speed ω of the swing rotation of the arm is controlled as expressed in equation (a), the scanning speed of the wafer in the Y direction is proportional to the beam current I of the ion beam.

Consequently, when the ion beam is equally scanned in the X direction, ions can be equally implanted into the entire surface of the wafer without being affected by the variation of the beam current I of the ion beam.

DETAILED DESCRIPTION OF THE INVENTION

Figure 1:
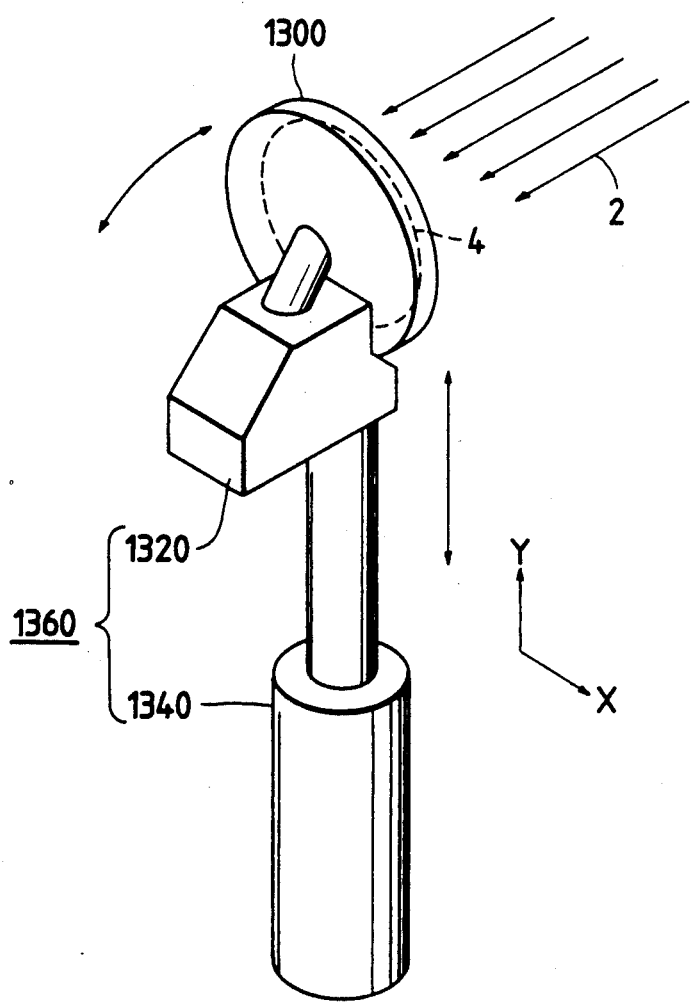
FIG. 1 is perspective view showing a main portion of a conventional ion implantation apparatus.
Figure 2:
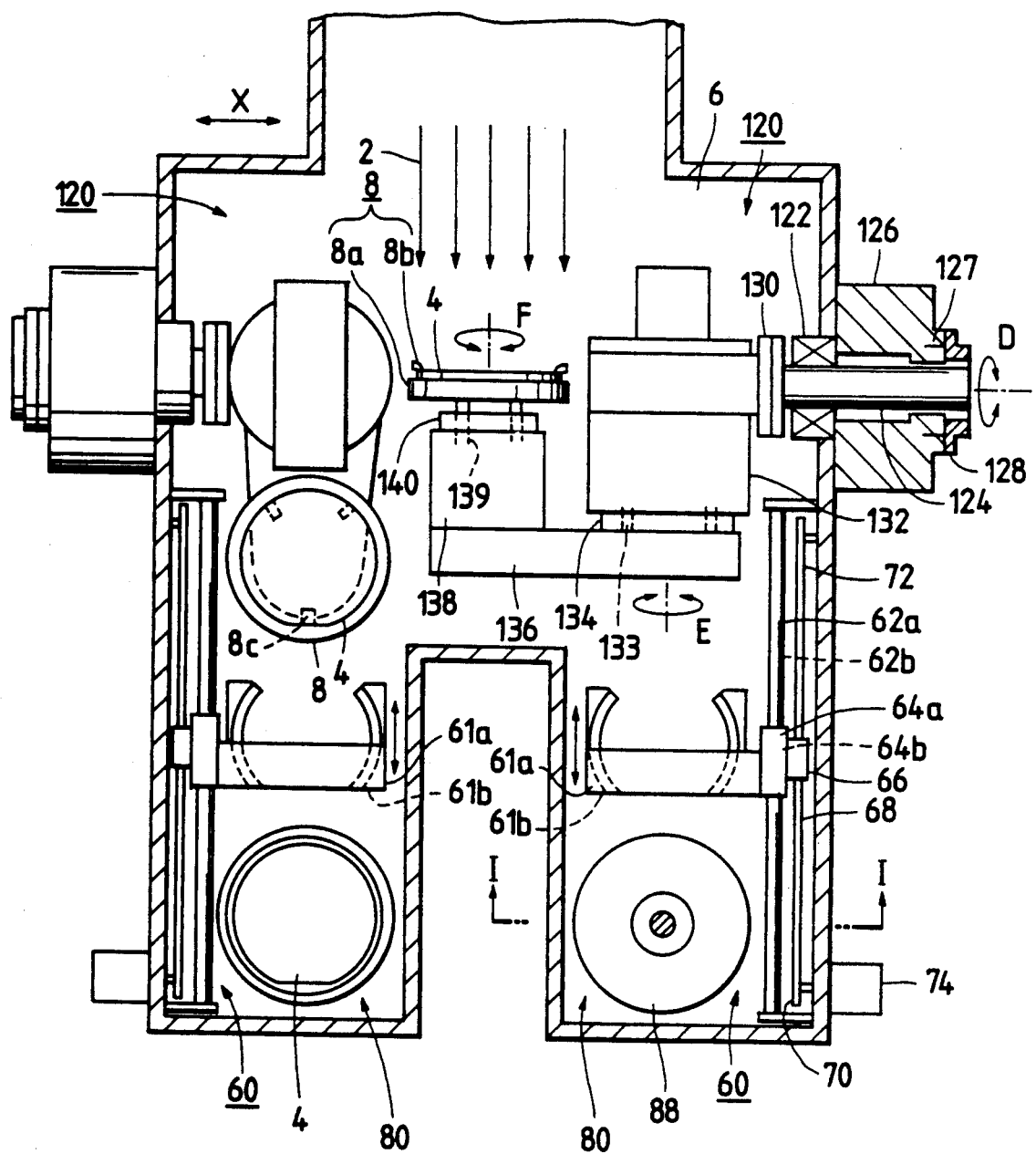
FIG. 2 is a horizontal sectional view showing a main portion of an ion implementation apparatus according to the first embodiment of the present invention.

FIG. 2 is a horizontal sectional view showing a main portion of an ion implantation apparatus according to the first embodiment of the present invention. In this embodiment, the same mechanisms are disposed symmetrically on the left and right sides of the beam line of an ion beam 2. So, in the following description, only the mechanism on the right side (of the figure) will be mainly explained.

The ion beam 2 is sent to an implantation chamber 6 exhausted into a vacuum by a vacuum pump (not shown), the ion beam 2 being electrically scanned in the X direction and parallelly arranged.

Figure 3:
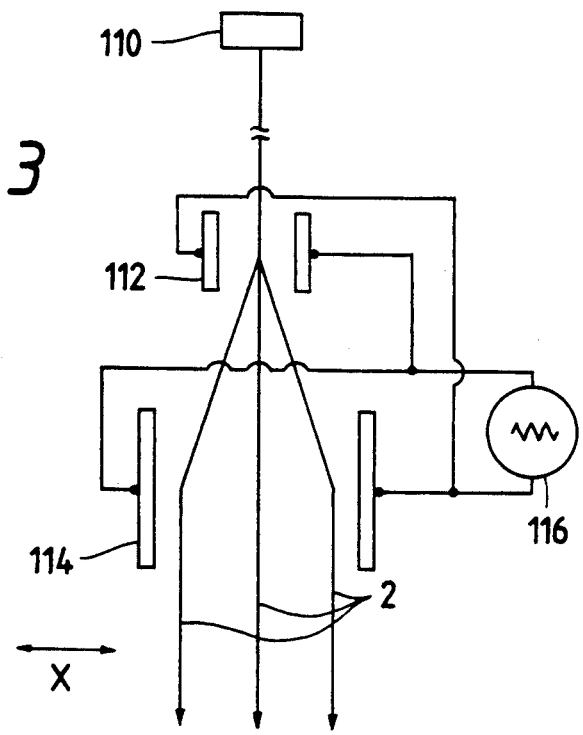
FIG. 3 is an outlined top view showing an example of electrical scanning means for an ion beam.

An example of means for scanning and arranging the ion beam 2 in parallel is shown in FIG. 3. The ion beam 2 is extracted from an ion source 110, and if necessary, the mass of the ion beam 2 is analyzed and the ion beam 2 is accelerated. The ion beam 2 is scanned in the X direction by two scanning electrodes 112 and 114 where reverse polarity scanning voltages (triangle wave voltages) are applied from the same scanning power supply 116 so that the ion beam 2 is parallelly arranged. As opposed to the above example, it is also possible to scan the ion beam 2 using a magnetic field.

It is preferable to provide only one beam line of the ion beam 2 (that is, an electrical scanning system of the ion beam 2) in view of simple structure, compactness and economy As shown in FIG. 2, on the left and the right of the implantation chamber 6, two holder drive units 120 are disposed, the structure of each holder drive unit 120 being the same.

The holder drive unit 120 of the present invention is characterized in that at least an arm 136 having a holder 8 is swingingly rotated so that a wafer 4 held by the holder 8 is mechanically scanned in the Y direction substantially perpendicular to the X direction in the implantation chamber 6.

In each holder drive unit 120 shown in the drawing, on the side wall section of the implantation chamber 6, a vacuum seal bearing 122 having a vacuum seal function is provided, which supports a spindle 124, the spindle 124 passing through the vacuum seal bearing 122.

On the outside of the implantation chamber 6, a first reversely rotatable direct drive motor 126 is disposed, an output shaft 127 of which is directly connected to the end section of the spindle 124 outside the implantation chamber via a coupling plate 128 rather than a gear and the like.

To the end section of the spindle 124 inside the implantation chamber, a second reversely rotatable direct drive motor 132 is connected via a coupling 130 in such a manner that an output shaft 133 of the second motor 132 is nearly perpendicular to the spindle 124.

In the direct drive motor 132, the inner section and the outer section thereof are vacuum sealed with an O ring (not shown) so that it can be used in vacuum condition. In addition, the output shaft 133 of the direct drive motor 132 and the motor case are vacuum sealed with a vacuum seal section 134 containing a magnetic fluid and the like.

An arm 136 is connected to the output shaft 133 of the direct drive motor 132 directly rather than via a gear and the like.

At the end of the arm 136, a third reversely rotatable direct drive motor 138 is disposed so that an output shaft 139 is nearly perpendicular to the arm 136.

In the direct drive motor 138, the inner section and the outer section thereof are vacuum sealed with an O ring (not shown) so that it can be used in vacuum condition. In addition, the output shaft 139 of the direct drive motor 138 and the motor case are vacuum sealed with a vacuum seal section 140 containing a magnetic fluid and the like.

The output shaft 139 of the direct drive motor 138 is connected to the holder 8, which holds the wafer 4, directly rather than via a gear and the like. Thus, as shown in FIG. 2, the surface of the wafer 4 held by the holder 8 can be faced to the ion beam 2. In this embodiment, the holder 8 is provided with a base 8a, a wafer supporter 8b which nips the wafer 4 against the base, and a wafer acceptor 8c which lifts and lowers the wafer 4.

According to the structure described above, by the first direct drive motor 126, the spindle 124 is rotated as shown by arrow D in the figure so that the holder 8 disposed at the end of the spindle 124 via the arm 136 and the like is driven in a predetermined implantation angle position (see the holder 8 on the right side of FIG. 2) and a horizontal position (see the holder 8 on the left side of FIG. 2) for handling the wafer 4.

Figure 4:
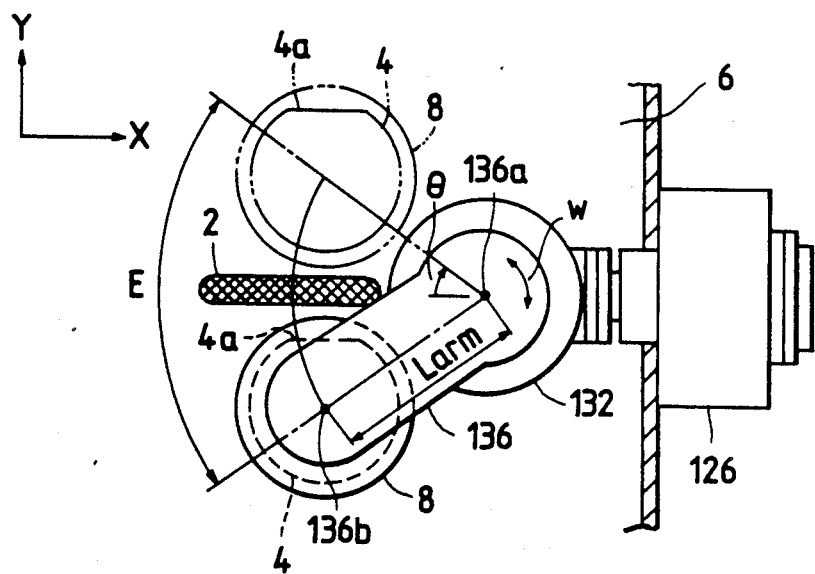
FIG. 4 is a view showing the posture of a holder driven by a holder drive unit as shown in FIG. 2 at the scanning.

When the second direct drive motor 132 is rotated in the forward and backward directions as shown by arrow E in the figure at the above implantation angle position, the holder 8 connected to the end section of the arm 136 is mechanically scanned in an arc shape in the Y direction while the wafer 4 held by the holder 8 is faced to the ion beam 2 (also see FIG. 4).

In addition, when the third direct drive motor 138 is rotated in the same direction and by the same angle as the second direct drive motor 132 (when viewed from the output shaft of each motor), as shown in FIG. 4, even if the holder 8 is scanned in an arc shape, the absolute rotation angle of the holder 8 is 0° and the posture is not changed. Thus, the posture of the wafer 4 mounted on the holder 8 is also not changed (for example, an orientation flat 4a of the wafer 4 in FIG. 4 is always faced upwardly regardless of the scanning position of the holder 8).

In addition, since the ion beam 2 is parallelly arranged in the X direction as described above, when the angular speed of the arm 136 is controlled, for example, so that the vertical speed component of the holder 8 is proportional to the beam current of the ion beam 2, it is possible to equally implant ions into the surface of the wafer 4 so that the dose amount becomes equal.

To drive both the direct drive motors 132 and 138 in the manner described above, for example, the same pulse signal is supplied to them.

To move the holder 8 to the handling position of the wafer as shown in the left side of FIG. 2, the holder 8 is horizontally placed by the direct drive motor 126 and the holder 8 is moved to the wall side by the direct drive motor 132.

To cool the wafer 4 on the holder 8, coolant may be flown to the holder in the following manner.

Since each center portion of the direct driven motors 126, 132, and 138 has a through hole, a holder shaft having a coolant path is mounted at the center of the holder 8, the holder shaft is passed through the center hole of the direct drive motor 138, and the coolant is supplied to and collected from the holder shaft which is rotated by a rotation joint disposed on the arm 136.

In addition, a flexible tube is connected to the rotation joint. The tube is passed through the center hole of the direct drive motor 132. The spindle 124 which passes through the center hole of the direct dire motor 126 is hollowed. The tube is passed through the spindle 124 and pulled to the air side. Thus, the coolant can be supplied and collected from the air side.

At each bottom section on the rear left and the rear right of the implantation chamber 6, a vacuum spare chamber 80 for unloading and loading the wafer 4 one by one between the inside of the implantation chamber 6 and air side is disposed.

Figure 5:
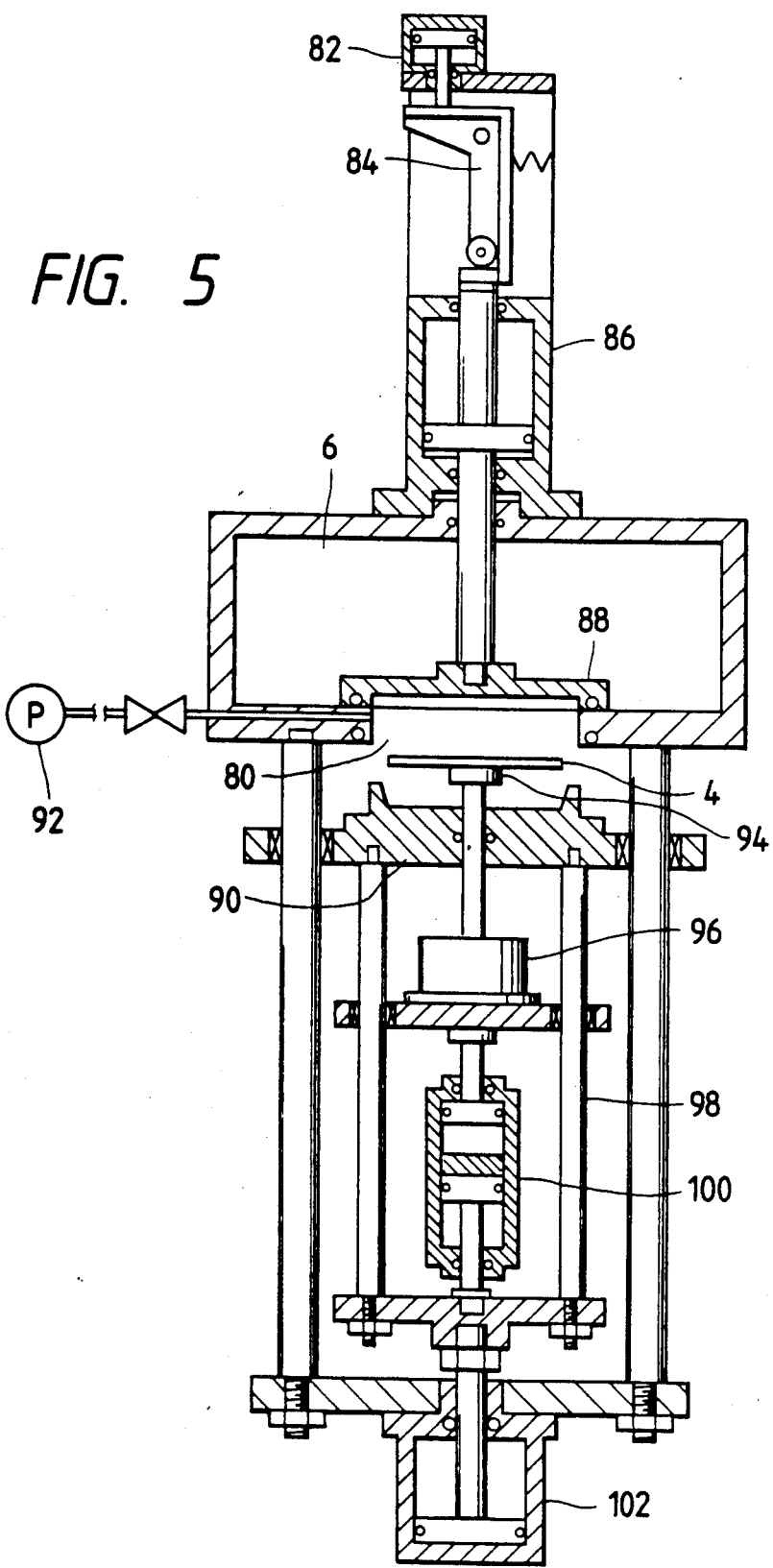
FIGS. 5 and 6 are sectional views taken along line I—I of FIG. 2, these figures showing different operation states.
Figure 6:
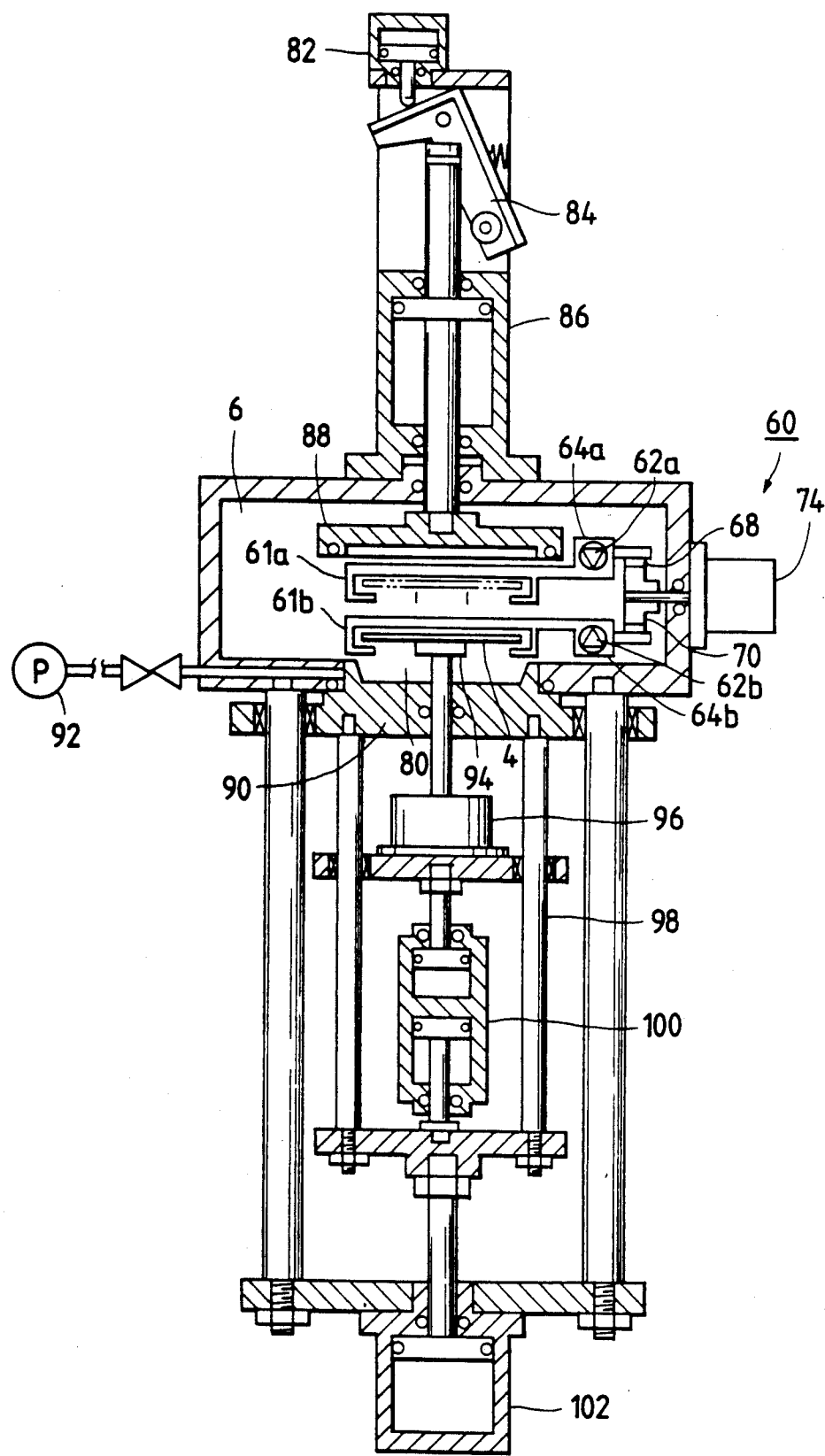

FIGS. 5 and 6 are sectional views of the vacuum spare chamber 80. FIG. 5 shows the state where a vacuum side valve 88 of the vacuum spare chamber 80 is closed and an air side valve 90 is opened FIG. 6 shows the state where the vacuum side valve 88 is opened and the air side valve 90 is closed FIG. 6 also shows a part of a wafer transfer unit 60 described later.

The vacuum spare chamber 80 will be described in detail. At the bottom section of the implantation chamber 6, the vacuum spare chamber 90 exhausted by a vacuum pump 92 is disposed. The vacuum side valve 88 for gating the implantation chamber 6 and the air side valve 90 for gating the air side are disposed on the upper and lower sides of the vacuum spare chamber 80, respectively.

The vacuum side valve 88 and the air side valve 90 are lifted/lowered and opened/closed by an air cylinder 86 disposed over the implantation chamber 6 and an air cylinder 102 disposed below the chamber via a guide shaft 98, respectively. A lever 84 and an air cylinder 82 disposed over the air cylinder 86 serve to lock the air cylinder 86.

Over the air side valve 90, a rotation table 94 for mounting the wafer 4 is disposed. The rotation table 94 is rotated by a motor 96 so as to adjust the orientation flatness of the wafer 4, and is lifted and lowered in two levels by a dual stroke cylinder 100 for handling the wafer 4.

Then, by referring to FIG. 2, a wafer transfer unit 60 disposed between the vacuum spare chamber 80 and the holder 8 in the horizontal position will be described.

Figure 7:
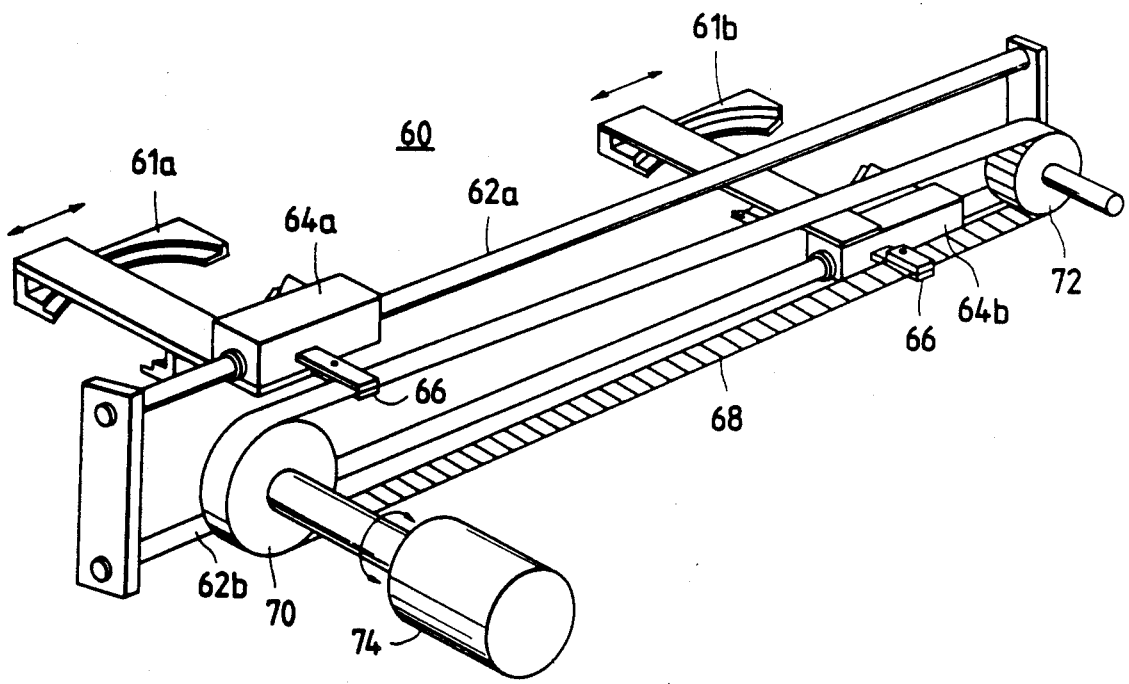
FIG. 7 is a perspective view showing a wafer transfer unit in FIG. 2.

As shown in FIG. 7, along the transfer path of the wafer 4 between the vacuum spare chamber 80 and the holder 8 in the horizontal position, a timing belt 68 is engaged between two grooved pulleys 70 and 72. The pulley 70 is connected to a motor 74 which can be rotated in the forward and reverse directions. On the upper and lower sides of the timing belt 68, a load side transfer arm 61a for mounting the wafer 4 via a connection member 66 and an unload side transfer arm unit 61b for mounting the wafer 4 via the connection member 66 are disposed, respectively.

As a guide means for guiding the transfer arms 61a and 61b along the timing belt 68 without rotating, in this embodiment, a ball spline is used. In other words, spline bearings 64a and 64b are disposed at the bases of the transfer arm 61a and 61b, respectively. In addition, upper and lower two spline shaft 62a and 62b which pass through the spline bearings 64a and 64b are disposed in parallel with the timing belt 68.

Instead of such ball splines, it is also possible to use two conventional guide shafts. However, by using the ball spline, only one spline shaft allows the transfer arm to be stably and horizontally guided without rotations.

Although the spline shafts 62a and 62b are shown as round rods, actually they have a plurality of ball rotating grooves in the round shape or a different shape.

Then, by mainly referring to the right side of FIG. 2, an example of the entire operation of the above described ion implantation apparatus will be explained.

The holder 8 is moved to the horizontal position by the holder drive unit 120 (for this state, see the holder 8 on the left side of FIG. 2). The wafer acceptor 8c and the wafer support 8b are driven by a drive unit (not shown) so that the wafer 4 is lifted to the position where it is transferred to the transfer arm unit 61b.

As shown in FIG. 6, in the vacuum spare chamber 80, both the upper and lower cylinders of the dual stroke cylinder 100 are operated. Thus, the rotation table 94 is remarkably lifted so that the wafer 4, where ions have not been implanted, is lifted to the position of the transfer arm 61a on the upper load side shown by the two-dot line. In this state, the timing belt 68 is driven by the motor 74 of the wafer transfer unit 60. The transfer arm 61a and the transfer arm 61b are moved simultaneously to the position over the vacuum spare chamber 80 and to that over the holder 8, respectively. The wafer acceptor 8c of the holder 8 is lowered and the wafer 4, where ions have been implanted, are placed on the transfer arm 61b. In the vacuum spare chamber 80, the rotation table 94 is lowered and the wafer 4, where ions have not been implanted, is placed on the transfer arm 61a.

Then, the motor 74 of the wafer transfer unit 60 is reversely rotated. The transfer arm 61b holding the wafer 4, where ions have been implanted, is moved to the position over the vacuum spare chamber 80. The transfer arm 61a holding the wafer 4, where ions have not been implanted, is moved to the position over the holder 8. In the vacuum spare chamber 80, only the upper cylinder of the dual stroke cylinder 100 is operated. The wafer 4 is transferred from the transfer arm 61b to a rotation table 64 (in the state shown by the solid line in FIG. 6). On the holder 8 side, the wafer 4 is transferred from the transfer arm 61a to the wafer acceptor 8c.

Then, the motor 74 of the wafer transfer unit 60 is reversely rotated. The transfer arm 61a and the transfer arm 61b are moved to the ready positions (in the state shown in FIG. 2). On the holder 8 side, the wafer acceptor 8c and the wafer support 8b are lowered so as to hold the wafer 4. The holder 8 is moved by the holder drive unit 120 to the ion implantation position as shown by the solid line in FIG. 2. Thus, the ion implantation preparation has been completed.

In the vacuum spare chamber 80, the rotation table 94 is lowered. After the vacuum side valve 88 is closed, the inside of the vacuum spare chamber 80 is resumed to the air pressured state. The air side valve 90 is opened (in the state shown in FIG. 5). By a transfer arm unit on the air side (not shown), the wafer 4, where ions have been implanted, is exited and the wafer 4 where irons have not been implanted is entered. At that time, while the holder 8 is mechanically scanned in the Y direction by the holder drive unit 120 in the implantation chamber 6, the ion beam 2 is irradiated to the wafer 4 on the holder 8 to implant ions in the wafer 4.

After that, the same operation described above is repeated as required.

Next, the relationship between the right side mechanism and the left side mechanism will be described. In this embodiment, while one side holder 8 (on the right of FIG. 2, for example) is scanned and ions are implanted in the wafer 4, the other side holder 8 is placed in the horizontal position so that the wafer 4 is handled (namely, the wafer 4 where ions have been implanted is exited and the wafer 4 where ions have not been implanted is entered). In other words, at the two holders 8, ion implantation and handling of the wafer 4 can be alternately carried out. Thus, the loss time for ion implantation and handling of the wafer 4 can be prevented, thereby improving the throughput.

In addition, since each arm 136 and each holder 8 are moved in an arc shape, the two holder drive units 120 can be closely disposed without their mechanical interference. Thus, the ion implantation apparatus can be compactly structured.

In addition, since both the wafers 4 are handled by both the holders 8 in the same condition, namely, in this embodiment, the height of both the holders 8 is the same and they can hold the wafers 4 in such a manner that the front surface of the wafers 4 is faced upwardly, the wafers 4 can be easily handled.

In addition, in the ion implantation apparatus of this embodiment, for the holder drive units 120, the direct drive motors 126, 132, and 128 are used. The motors directly drive the required portions. Thus, the structure of each holder drive unit 120 can be much simplified.

As described above, according to this embodiment, since each holder drive unit uses a direct drive motor which directly drives the required portion, the structure of the holder drive apparatus, in other words, the entire structure of the ion implantation apparatus can be much simplified.

That is, (1) in the holders of the left and right side holder drive units, ion implantation and wafer handling can be alternately conducted. Thus, the loss time for the ion implantation and the wafer handling can be almost prevented, thereby improving the throughout. (2) Since each arm and each holder move in an arc shape, both the holder drive units can be closely disposed without the mechanical interference. Thus, it is possible to compactly structure the ion implantation apparatus. (3) Since handling of the wafer to both the holders can be conducted in the same condition, the wafers can be easily handled.

Figure 8:
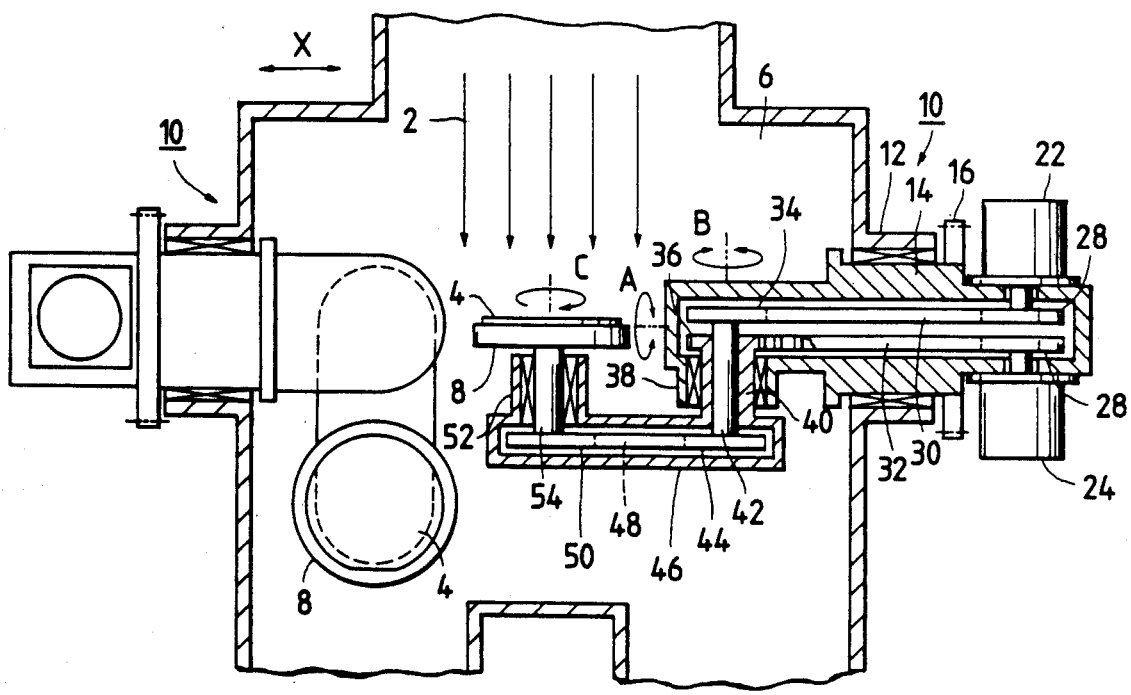
FIG. 8 is a perspective view showing a main portion of an ion implantation apparatus according to the second embodiment of the present invention.
Figure 9:
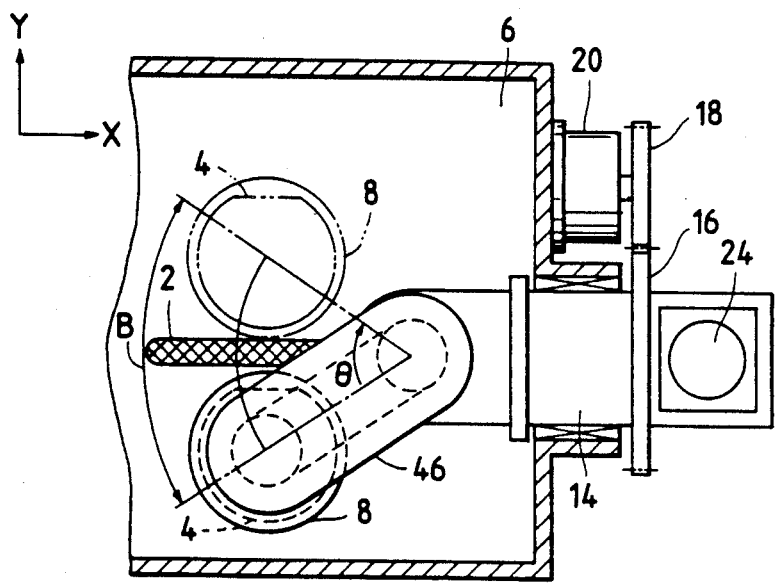
FIG. 9 is a view showing the posture of a holder driven by a holder drive unit in FIG. 8 at the scanning.

Next, with reference to FIGS. 8 and 9, an ion implantation apparatus of the second embodiment will be described. In this ion implantation apparatus, two holder drive units 10 in the same structure are disposed on the left and the right of an implantation chamber 6 where an ion beam 2, which is electrically scanned and parallelly arranged, is entered.

In each holder drive unit 10, there are provided a vacuum seal bearing 12 on the side wall of the implantation chamber 6, a support shaft 14 being passed through the vacuum seal bearing 12, and a gear 16 being disposed on the air side. The support shaft 14 is rotated in the direction of arrow A by a motor 20 and a gear 18, and a holder 8 disposed at the end thereof via an arm 46 is placed between a predetermined implantation angle position and a horizontal position for handing a wafer 4.

On the vacuum side of the support shaft 14, a hollow arm shaft 40 and the arm 46 are rotatably supported by a vacuum seal bearing 38.

At one end of the arm shaft 40, a pulley 36 is disposed. In addition, a timing belt 32 is connected to a motor 24 connected to the support shaft 14 in the air side and to a pulley 28. The motor 24 rotates the arm shaft 40 both in the forward and backward directions, thereby rotating the arm 46 in the direction of arrow B and then mechanically scanning the holder 8 in the Y direction.

At the end section of the arm 46, a vacuum seal bearing 52 is provided, which rotatably supports a holder shaft 54 and the holder 8. The holder 8 for supporting the wafer 4 is nearly perpendicularly connected to the end section of the holder shaft.

The holder shaft 54 is provided with a pulley 50. An intermediate shaft 42 is rotatably passed through the center section of the arm shaft 40. At both the ends of the intermediate shaft, a pulley 34 and a pulley 44 are provided. The pulley 44 and the pulley 50 having the same diameter are connected via a timing belt 48.

A motor 22 disposed on the air side of the support shaft 14, the pulley 26 and the pulley 34 are connected via a timing belt 30. The motor 22 can rotate the holder 8 stepwise as shown by arrow C, for example. However, when ions are implanted, the holder 8 is not rotated. In this case, even if the arm shaft 40 is rotated as shown by arrow B, the intermediate shaft 42 does not rotate along with the arm shaft 40.

When the holder 8 is scanned, the intermediate shaft 42 and the pulley 44 are stopped as described above. In this state, when the arm 46 is rotated by the motor 24 by 8° in the clockwise directions shown in FIG. 9, the pulley 44 is rotated by 0° in the counterclockwise direction when viewed from the arm 46. The pulley 50 whose diameter is the same as the pulley 44 connected via the timing belt 48, are rotated by 0° when viewed from the arm 46. Thus, although the holder 8 is scanned in such a manner that it draws an arc with the radius equal to the length of the arm 46 in the Y direction, the absolute rotation angle is 0° and the posture is not changed. Thus, also the posture of the wafer 4 mounted on the holder 8 is not changed In addition, since the ion beam 2 is parallelly arranged in the X direction, it is possible to equally implant ions in the wafer 4.

Since handling of the wafer 4 can be conducted in the same manner as in the first embodiment, the description thereof will be omitted.

According to the ion implantation apparatus of the second embodiment, (1) at the holders 8 of the left and right side holder drive units 10, ion implantation and handling of the wafer 4 can be conducted alternately. Thus, the loss time for the ion implantation and handling of the wafer can be almost prevented, thereby improving the throughput. (2) Since each arm 46 and each holder 8 move in an arc shape, both the holder drive units 10 can be closely disposed without the mechanical interference. Thus, it is possible to compactly structure the ion implantation apparatus. (3) Since handling of the wafer 4 to both the holders 8 can be conducted in the same condition, that is, in this embodiment, since the wafers 4 can be handled in the same height, and be faced upwardly in the handling, the wafers can be easily handled.

Next, a method of controlling the above described ion implantation apparatus in which ion implantation into the entire of a wafer can be uniformly conducted without being affected by variation of beam current of an ion beam, will be described. The control method comprises the step of controlling an angular speed $\omega$ so that the following equation or the relationship substantially equivalent thereto is satisfied;

$$\omega = \{a/(L_{arm} \cdot \cos\theta)\} I \qquad (a)$$

wherein (see FIG. 4)
I: a beam current of an ion beam 2,
$L_{arm}$: a length between a center 136a of swing rotation of an arm 136 and a point 136b at the center of a wafer 4,
$\theta$ an angle of the arm 136 at swing rotation from the X direction,
$\omega$: an angular speed of the arm at the swing rotation, and
$a$: a proportional constant.

When the angular speed $\omega$ of the swing rotation of the arm 13b is controlled as expressed in equation (a), the scanning speed of the wafer 4 in the Y direction is proportional to the beam current I of the ion beam 2. Consequently, when the ion beam 2 is equally scanned in the X direction, ions can be equally implanted into the entire surface of the wafer 4 without being affected by the variation of the beam current I of the ion beam 2.

The control according to the equation (a) describe above is practically conducted by using a microcomputer as a control apparatus. In addition, as the motors, pulse motors or servo motors which can be digitally controlled are used. An embodiment of such a control method will be described in detail.

Figure 10:
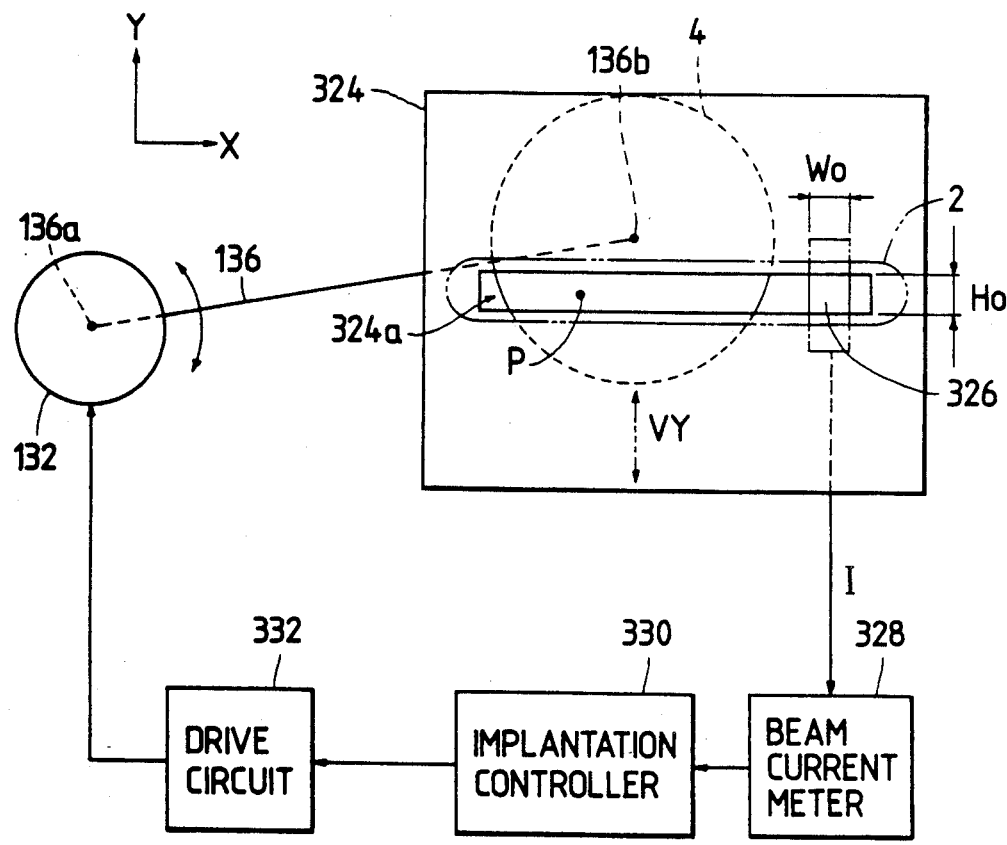
FIG. 10 is a conceptual diagram describing the control method according to the third embodiment of the present invention, which is equivalent to a view in the vicinity of the wafer shown in FIG. 2 viewed from the upstream of the ion beam.

FIG. 10 is a conceptual diagram describing the control method according to the present invention. This figure is equivalent to a view of a wafer viewed from the upstream side of the ion beam in FIG. 2. The same portions and the equivalent portions as in FIGS. 2 and 4 are designated by the same numerals.

In this embodiment, to accomplish the control method described above, the following means is used.

That is, to make a shaped ion beam 2, which is electrically scanned in the X direction, incident on the wafer 4, a mask 324 with a slit 324a is disposed in front of the wafer 4.

In addition, to accurately measure the beam current I of the ion beam 2 irradiated to the wafer 4, a Faraday cup 326 is disposed behind the mask 324 and adjacent to the wafer 4 in the X direction. The beam current I is converted into an electric charge amount (Q pulse which will be described later) by a beam current meter 328 and sent to an implantation controller 330.

The implantation controller 330 is provided with a microcomputer which computes the rotation of a motor 132 for swingingly rotating the arm 136 and sends a drive signal to a drive circuit 332 of the motor 132 so as to equally implant ions in the entire of the wafer 4.

The control method of the implantation controller 330 will be described. In the following description, the scanning operation of the ion beam 2 in the x direction is named "sweeping operation". One sweeping operation means one reciprocal operation of the ion beam 2 in the X direction. The operation for moving and scanning the wafer 4 in the Y direction is named "scanning operation" hereinafter. (1) By sweeping the ion beam 2 in the X direction, the ion beam 2 is entered to the Faraday cup 326.

At that time, since the area of the opening section of the Faraday cup 326 is known (namely, $S_0 = H_0 \cdot W_0$), the amount of implantation can be obtained from the amount of electric charge of the ion beam 2 entered to the Faraday cup 326.

Assume that the number of electric charge pulses (Q pulses) according to the beam current which flows in the Faraday cup 326 per sweeping operation of the ion beam 2 is $q_{mon}$.

The amount of electric charge per Q pulse is c (coulomb/pulse).

Thus, the total amount of electric charge given to the Faraday cup 326 per sweeping operation becomes $c \cdot q_{mon}$ (coulomb).

At that time, since the area of the opening section of the Faraday cup 326 is represented by ($S_0 = H_0 \cdot W_0$), the amount of implantation $\phi_{mon}$ to the Faraday cup 326 is given by the following equation.

$$\phi_{mon} = c \cdot q_{mon}/(e \cdot S_0) \qquad (1)$$

where e is the elementary electric charge.

(2) Since the ion beam 2 is swept in the X direction, the amount of implantation $\phi_{mon}$ obtained in the equation (1) is also the amount of implantation given to any point P on the wafer 4.

When the point P on the wafer 4 is moved to the Y direction by $\Delta Y$ per sweeping operation, the total amount of implantation $\phi_p$ which is given to the point P which is passed through the slit 324a of the mask 324 is expressed by the following equation.

$$\phi_p = (H_0/\Delta Y)\phi_{mon} \quad (2)$$

In the above equation, it is assumed that while the point P is passed through the slit 24a, the shape of the ion beam 2 does not change.

$\phi_{mon}$ obtained in the equation (1) is the average value of $S_0$. (Thus, there is a distribution of darkness and brightness in $S_0$). However, the point P is moved to the Y direction and thereby it is passed through all the dark and thin portions.

Thus, unless the shape of the ion beam 2 changes, the amount of implantation can be obtained from the equation (2). (3) Conversely, when setting the amount of implantation at any point P on the wafer 4 to $\phi_p$, it is sufficient to control the movement of the wafer 4 in the Y direction so as to satisfy the following equation (3) obtained by transforming the equation (2).

$$\Delta Y = H_0 \cdot \phi_{mon}/\phi_p \quad (3)$$

where $\Delta Y$: the moving length of the wafer 4 in the Y direction per sweeping operation.

(4) the wafer 4 is mechanically moved (scanned) in the Y direction. It is assumed that the maximum value (mechanical limit value) of the moving speed at that time is $VY_{max}$.

When the moving length in the Y direction and the maximum scanning frequency are LY and FY, respectively, the following equation is satisfied.

$$VY_{max} = 2 \cdot LY \cdot FY \quad (4)$$

In addition, the instantaneous speed VY in the Y direction is given from the equation (3).

$$\begin{aligned} VY &= \Delta Y \cdot FX \\ &= (H_0 \cdot \phi_{mon}/\phi_p)FX \end{aligned} \quad (5)$$

where FX is the sweep frequency of the ion beam 2 in the X direction.

From the maximum speed condition, the following equations should be satisfied.

$$VY \leq VY_{max} \quad (6)$$

where $V_{max}$ is the maximum value of the scanning speed of the wafer 4 in the Y direction.

Considering the condition $VY = VY_{max}$ in the equation (6), it is assumed that the amount of implantation given to any point P on the wafer 4 is $\phi_{pmin}$ (when the scanning speed is maximum, the amount of implantation given to the point P on the wafer 4 becomes minimum).

From the equation (5), $\phi_{pmin}$ is given and expressed as follows.

$$\phi_{pmin} = H_0 \cdot \phi_{mon} \cdot FX/VY_{max} \quad (7)$$

$\phi_{pmin}$ is the minimum value of the amount of implantation where ions can be implanted in one way scanning operation. In other words, with this beam current, ions which exceed the minimum value must be implanted per one way scanning operation. (Of course, by decreasing the beam current, ions which are less than the minimum value can be implanted.)

(5) When the setting value of the amount of implantation into the entire surface of the wafer 4 is $\phi_0$, since ions which are more than $\phi_{pmin}$ can be implanted per one way scanning operation (the amount of implantation is reversely proportional to the scan speed), the number of scanning operation times is obtained from the following equation.

$$n_{scan} = [\phi_0/(2 \cdot \phi_{pmin})] \quad (8)$$

(the factor 2 is used to obtain the number of scanning operation times in reciprocation because $\phi_{pmin}$ corresponds to a one way scanning operation).

Where the symble [] is the Gausse' notation which represents an integer which do not exceed a specified value.

(6) To obtain the total amount of implantation $\phi_0$ by performing the number of scanning operation times ($n_{scan}$) obtained in the equation (8), the amount of implantation per one way scanning operation is given by the following equation.

$$\phi_{p0} = \phi_0/(2 \cdot n_{scan}) \quad (9)$$

(7) To simplify $\phi_{p0}$ obtained in the equation (9), by referring to the equation (1), $\phi_{p0}$ is expressed by parameter $q_{p0}$ as follows.

$$\phi_{p0} = c \cdot q_{p0}/(e \cdot S_0) \quad (10)$$

$q_{p0}$ is the amount of implantation per one way scanning operation which is expressed in the same unit as $q_{mon}$ (in the unit of Q pulse).

By using $\phi_{p0}$, when the moving length of the wafer 4 in the Y direction per sweeping operation for implanting ions is expressed, the following equation is obtained.

$$\begin{aligned} \Delta Y &= H_0 \cdot \phi_{mon}/\phi_{p0} \\ &= H_0 \cdot q_{mon}/q_{p0} \end{aligned} \quad (11)$$

(8) Now, the m-th sweeping operation of the ion beam 2 is considered.

When the amount of electric charge given to the Faraday cup 26 in this sweeping operation is $q_m$ in the counting unit, the length $\Delta Y_m$ by which the wafer 4 is moved in the Y direction during the next sweeping operation is given by the following equation.

$$\Delta Y_m = H_0 \cdot q_m/q_{p0} \quad (12)$$

Thus, $Y_m$ which is the position (in the Y direction) of the ion beam 2 on the wafer 4 upon completion of the m-th sweeping operation {namely, the length from the reference position (=position when the first sweeping operation is conducted)} is expressed by the following equation.

$$Y_m = \sum_i^m \Delta Y_i \qquad (13)$$

$$= \sum_i^m H_p O \cdot q/q_{po}$$

$$= (H_0/q_{p0}) \sum_i^m q_i$$

where $$Q_m = \sum_i^m q_i \qquad (14)$$

The equation (14) means that the total amount of electric charge given until the m-th sweeping operation is $Q_m$.

By using $Q_m$, $Y_m$ can be expressed as follows.

$$Y_m = (H_0/q_{p0})Q_m \qquad (15)$$

Figure 11:
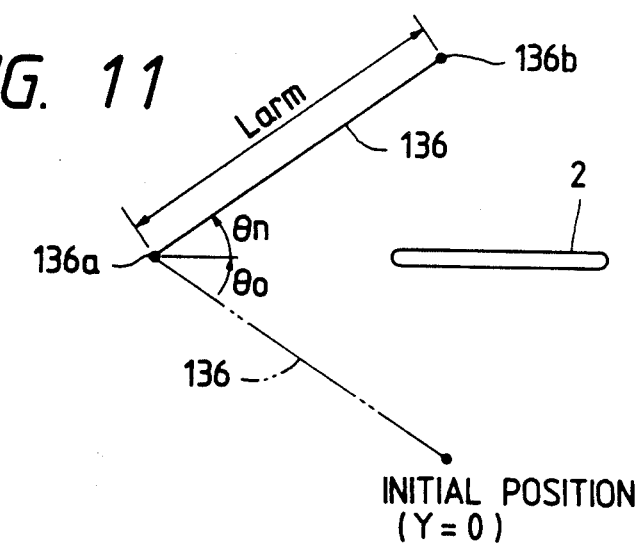
FIG. 11 is a descriptive view of the arm angle.

(9) Since the wafer 4 is fixedly moved only in the circle by the arm 136 (however, the posture of the wafer 4 is not changed), by referring to FIG. 11, the following relationship can be obtained between the angle of the arm 136 and the position of the wafer 4 in the Y direction.

$$Y_m = L_{arm} \cdot \sin(\theta_n) + L_{arm} \cdot \sin(\theta_0) \qquad (16)$$

where $\theta_n$: an angle of the arm 136 from the horizontal level,
$\theta_0$: an angle of the arm 136 from the initial position to the horizontal level, and
$L_{arm}$: the length between the center 136a of the swing rotation of the arm 136 and the point 136b corresponding to the center of the wafer 4.

When a pulse motor or a servo motor for the motor 132 which drives the arm 136 is used, the arm 136 is driven stepwise rather than at any position In this case, assuming that the width of the minimum section of the arm drive angle is $\Delta\theta$, the angle position of the arm 136 is expressed with integer (n) as follows.

$$\theta_0 = n_0 \cdot \Delta\theta \qquad (17)$$

$$\theta_n = n \cdot \Delta\theta \qquad (18)$$

In this case, from the equations (15) and (16), the following equation can be satisfied.

$$Y_m = L_{arm} \cdot \sin(n \cdot \Delta\theta) + L_{arm} \cdot \sin(n_0 \cdot \Delta\theta) \qquad (19)$$

$$= (H_0/q_{p0}) Q_m$$

In other words, when the m-th sweeping operation is completed, the position n of the arm 136 should be expressed as follows.

$$L_{arm} \cdot \sin(n \cdot \Delta\theta) + L_{arm} \cdot \sin(n_0 \cdot \Delta\theta) = (H_0/q_{p0}) Q_m \qquad (20)$$

(10) When both the sides of the equation (20) are divided by $L_{arm} \cdot \Delta\theta$ and the difference between both sides obtained is expressed by $G(n, Q_m)$, the following equation is satisfied.

$$G(n, Q_m) = \{\sin(n \cdot \Delta\theta) + \sin(n_0 \cdot \Delta\theta)\}/\Delta\theta - \qquad (21)$$

$$\{H_0/(q_{p0} \cdot L_{arm} \cdot \Delta\theta)\} \cdot Q_m$$

where $H_0/(q_{p0} \cdot L_{arm} \cdot \Delta\theta)$ is constant. Thus, when the following equation is given, $$K = H_0/(q_{p0} \cdot L_{arm} \cdot \Delta\theta) \qquad (22)$$

the following equation is obtained.

$$G(n, Q_m) = \{\sin(n \cdot \Delta\theta) + \sin(n_0 \cdot \Delta\theta)\}/\Delta\theta - K \cdot Q_m \qquad (23)$$

The equation (23) represents that the difference between both the sides of the equation (20) is expressed by $G(n, Q_m)$. Thus, to satisfy the equation (20), the difference $G(n, Q_m)$ should be 0.

However, since n and $Q_m$ are actually integer values it cannot be always set $G(n, Q_m)$ to 0. Thus, the goal of the control is to approach $G(n, Q_m)$ to 0 as close as possible.

(11) When n and $Q_m$ are varied, $G(n, Q_m)$ is expressed as follows.

$$G(n, Q_m + 1) = G(n, Q_m) - K \qquad (24)$$

$$G(n + 1, Q_m) = \{\sin((n + 1) \cdot \Delta\theta) + \qquad (25)$$

$$\sin(n_0 \cdot \Delta\theta)\}/\Delta\theta - K \cdot Q_m = \{\sin((n + 1) \cdot \Delta\theta) -$$

$$\sin(n \cdot \Delta\theta)\}/\Delta\theta + G(n, Q_m)$$

(12) In a particular state (after the m-th sweeping operation is completed and the scanning operation in the Y direction is also completed), when it is assumed that the following equation is satisfied.

$$G(n, Q_m) = G_{n,m} \qquad (26)$$

In this case, since an actual state is considered, n and $Q_m$ are integers and generally the following condition takes place.

$$G_{n,m} \neq 0 \qquad (27)$$

(13) When the m+1 -th sweeping operation is performed and electric charge $q_{m+1}$ is obtained, the following equation is satisfied, $$Q_{m+1} = Q_m + q_{m+1} \qquad (28)$$

At this time, by referring to the equation (24), G can be transformed as follows.

$$G_{n,m+1}^* = G_{n,m} - K \cdot q_{m+1} \qquad (29)$$

(where the superscript * represents that $G_{n,m+1}$ is not a last value, namely, the value is not $G_{n,m+1}$ expressed in the equation (26).)

$G_{n,m+1}^*$ is remarkably away from 0.

In the sweeping operation which just precedes, since $G_{n,m} \approx 0$ (where $\delta > G_{n,m} > 0; \delta < \{\sin((n+1) \cdot \Delta\theta) - \sin(n \cdot \Delta\theta)\}/\Delta\theta)$, approximately, the following result is obtained.

$$G_{n,m+1}^* = -K \cdot q_{m+1} < 0.$$

The operation of adding $\{\sin((n+1)\cdot\Delta\theta) - \sin(n\cdot\Delta\theta)\}/\Delta\theta$ expressed in the equation (25) to $G_{n,m+1}^*$ and approaching $G_{n+k,m+1}^*$ to 0 (continue the moving step at n (=arm angle) until the value becomes more than 0) is conducted.

(15) Namely, the following steps are conducted in succession.

$$G_{n+1,m+1}^* = G_{n,m+1}^* \cdot \{\sin((n+1)\cdot\Delta\theta) - \sin(n\cdot\Delta\theta)\}/\Delta\theta < 0 \quad (30)$$

<Rotate the arm 136 by one step.>

$$G_{n+2,m+1}^* = G_{n-1,m+1}^* + \{\sin((n+2)\cdot\Delta\theta) - \sin((n+1)\cdot\Delta\theta)\}/\Delta\theta < 0 \quad (31)$$

<Rotate the arm 136 for one step.>

$$G_{n+k,m+1}^* = G_{n+k-1,m+1}^* + \{\sin((n+k)\cdot\Delta\theta) - \sin((n+k-1)\cdot\Delta\theta)\}/\Delta\theta \geq 0 \quad (32)$$

(16) When $G_{n+k,m+1}^*$ becomes more than 0, the required angle step drive operation of the arm 136 is completed. At that time, the following equation is satisfied.

$$G(n+k, Q_{m+1}) = G_{n+k,m+1} = G_{n+k,m+1}^* \quad (33)$$

The equation (33) represents the starting value of the new G value.

$G_{n+k,m+a}$ is regarded as new $G_{n,m}$ and the steps from the step (13) are conducted.

(17) When the m+1 -th sweeping operation is completed and the required angle step (k -th step) of the arm 136 is completed, from the equations (30), (31), (32), and (33), the following equation should be satisfied.

$$G_{n+k,m+1} = G_{n,m+1}^* + \{\sin((n+k)\cdot\Delta\theta) - \sin(n\cdot\Delta\theta)\}/\Delta\theta \geq 0 \quad (34)$$

In the above equation, since $G_{n,m+1}$, n, and $\Delta\theta$ are known values (thus, $\sin(n\cdot\Delta\theta)$ is known), the value k should satisfy the following equation.

$$\sin((n+k)\cdot\Delta\theta) \geq \sin(n\cdot\Delta\theta) - G_{n,m+1}^* \cdot \Delta\theta \quad (35)$$

In the above equation, when <R is a right angle, the following equation is satisfied, $$-<R \leq (n+k)\cdot\Delta\theta = \theta \leq <R \quad (36)$$

thus, $$(n+k)\cdot\Delta\theta \geq \text{Arc}\sin\{\sin(n\cdot\Delta\theta) - G_{n,m+1}^* \cdot \Delta\theta\} \quad (37)$$

thus, the value k can be expressed as follows.

$$k \geq \text{Arc}\sin\{\sin(n\cdot\Delta\theta) - G_{n,m+1}^* \cdot \Delta\theta\}/\Delta\theta - n \quad (38)$$

From the equation (37), the value k can be obtained. However, in the above equation, the following equation should be satisfied.

$$G_{n,m+1}^* = G_{n,m} - K\cdot q_{m+1} \quad (39)$$

As described above, the control according to the equation (a) can be digitally executed.

As described above according to the control method of the present invention, in the hybrid scan system ion implantation apparatus in which an ion beam is electrically scanned and a wafer is mechanically scanned in the direction perpendicular to the scanning direction of the ion beam by using a swing arm, ions can be uniformly implanted into the entire surface of the wafer without being affected by the variation of the beam current of the ion beam.

Further, according to the present invention, since a conventional expensive dynamic vacuum seal system is not used, it is not necessary to use a high power vacuum pump and this type of apparatus can be constructed economically.

In the above described embodiments, although the description is carried out on a so-called parallel beam in which an ion beam is scanned in the X direction and is arranged in parallel, the present invention is not limited thereto. That is, it is possible to construct an ion implantation apparatus in which the ion beam is simply scanned in the X direction and an arm with a holder is swingingly rotated so that a wafer is mechanically scanned in the Y direction substantially perpendicular to the X direction in which the ion beam is scanned.

Also, in the above described embodiments, although the description is carried out on a dual platen system ion implantation apparatus in which two holder drive units are used, the present invention can be applied to an ion implantation apparatus in which only one holder drive unit is used. Also in this case, an economical and compact ion implantation apparatus can be obtained as compared with a conventional apparatus in which a wafer is driven linearly.

What is claimed is:

1. An ion implantation apparatus, comprising:
   an implantation chamber into which an ion beam is entered, said ion beam being scanned in an X direction;
   a holder for holding a wafer in said implantation chamber; and
   a holder drive unit for mechanically scanning said holder in a Y direction substantially perpendicular to said X direction in said implantation chamber;
   wherein said holder drive unit swingingly rotates said holder so that said wafer is mechanically scanned in said Y direction.

2. An ion implantation apparatus as claimed in claim 1, wherein said holder drive unit comprises direct motors disposed in said implantation chamber.

3. An ion implantation apparatus as claimed in claim 1, wherein said holder drive unit comprises a bearing having a vacuum seal function disposed on a side wall section of said implantation chamber; a spindle passed through said bearing in said X direction; a first reversely rotatable direct drive motor, whose output shaft is connected to an end section of said spindle outside said implantation chamber; a second reversely rotatable direct drive motor, whose output shaft is connected to an end section of said spindle inside said implantation chamber, said output shaft of said second direct motor being nearly perpendicular to said spindle; an arm connected nearly perpendicularly to said output shaft of said second direct drive motor; and a third reversely rotatable direct drive motor, whose output shaft is connected nearly perpendicularly to said arm; and wherein said holder is connected nearly perpendicularly to said output shaft of said third direct drive motor.

4. An ion implantation apparatus as claimed in claim 1, wherein said holder drive units comprises a hollow arm shaft pivotally supported in said implantation chamber in such a manner that said arm shaft is placed nearly in parallel to moving direction of said ion beam; a drive means for rotatably driving said arm shaft both in forward and backward directions; an intermediate shaft rotatably passed through said arm shaft, said intermediate shaft not following the rotation of said arm shaft; an arm connected nearly perpendicularly to said arm shaft; a holder shaft pivotally supported at an end section of said arm so that said holder shaft is placed nearly in parallel to the moving direction of said ion beam, said holder being connected nearly perpendicularly to an end section of said holder shaft; and connection means for connecting said holder shaft and said intermediate shaft at a given rotation ratio.

5. An ion implantation apparatus as claimed in claim 1, wherein said ion beam is scanned by only one electrical scanning system.

6. An ion implantation apparatus as claimed in claim 1, further comprising a second holder for holding a second wafer and a second holder drive unit in said implantation chamber, said two holders and said two holder drive units being equivalent to each other so that while ions are implantated into one of said wafers, the other of said wafers is taken out from or mounted on said holder.

7. An ion implantation apparatus as claimed in claim 1, wherein said ion beam is arranged in parallel by a magnetic field.

8. An ion implantation apparatus as claimed in claim 1, wherein said ion beam is arranged in parallel by an electric field.

9. A ion implantation apparatus as claimed in claim 1, further comprising means for driving said holder at a predetermined implantation angle position.

10. An ion implantation apparatus as claimed in claim 1, further comprising means for rotating said holder stepwise by a predetermined angle with respect to said ion beam.

11. In a method for controlling an ion implantation apparatus, comprising the steps of:
electrically scanning an ion beam in an X direction;
rotating an arm swingingly; and
scanning a wafer held at an end of said arm mechanically in an irradiation area of said ion beam in a Y direction substantially perpendicular to the X direction, said wafer being kept in a particularly posture,
the improvement comprising the step of:
controlling an angular speed $\omega$ so that the following equation or the relation substantially equivalent thereto is satisfied:

$$\omega = \{\alpha/(L_{arm} \cdot \cos\theta)\} I$$

wherein
I: a beam current of said ion beam,
$L_{arm}$: a length between a center of swing rotation of said arm and a center of said wafer,
$\theta$: an angle of said arm at swing rotation from the X direction,
$\omega$: an angular speed of said arm at the swing rotation, and
$\alpha$: a proportional constant.

* * * * *

UNITED STATES PATENT AND TRADEMARK OFFICE
CERTIFICATE OF CORRECTION

PATENT NO. : 5,003,183

DATED : March 26, 1991

INVENTOR(S) : MAMORU NOGAMI ET AL.

It is certified that error appears in the above-identified patent and that said Letters Patent is hereby corrected as shown below:

Claim 11, Column 18, Line 18, change "particularly" to --particular--.

Signed and Sealed this

Twenty-ninth Day of December, 1992

Attest:

DOUGLAS B. COMER

Attesting Officer     Acting Commissioner of Patents and Trademarks